(12) United States Patent
Rädler et al.

(10) Patent No.: US 10,768,233 B2
(45) Date of Patent: *Sep. 8, 2020

(54) METHOD AND DEVICE FOR TESTING A TAP CHANGER OF A TRANSFORMER

(71) Applicant: Omicron Electronics GmbH, Klaus (AT)

(72) Inventors: Michael Rädler, Klaus (AT); Boris Unterer, Feldkirch (AT)

(73) Assignee: Omicron Electronics GmbH, Klaus (AT)

( * ) Notice: Subject to any disclaimer, the term of this patent is extended or adjusted under 35 U.S.C. 154(b) by 304 days.

This patent is subject to a terminal disclaimer.

(21) Appl. No.: 15/315,238

(22) PCT Filed: Jun. 29, 2015

(86) PCT No.: PCT/EP2015/064712
§ 371 (c)(1),
(2) Date: Nov. 30, 2016

(87) PCT Pub. No.: WO2016/001149
PCT Pub. Date: Jan. 7, 2016

(65) Prior Publication Data
US 2017/0123006 A1 May 4, 2017

(30) Foreign Application Priority Data

Jul. 2, 2014 (AT) ............................... A 50459/2014

(51) Int. Cl.
*G01R 31/327* (2006.01)
*G01R 31/62* (2020.01)
*H01H 9/00* (2006.01)

(52) U.S. Cl.
CPC ......... *G01R 31/3274* (2013.01); *G01R 31/62* (2020.01); *H01H 9/0005* (2013.01); *G01R 31/3275* (2013.01); *H01H 2009/0061* (2013.01)

(58) Field of Classification Search
None
See application file for complete search history.

(56) References Cited

U.S. PATENT DOCUMENTS 5,804,954 A * 9/1998 Laplace, Jr. ............ G05F 1/147
                                                              323/256
7,859,232 B2 * 12/2010 Berggren ............... H02J 3/1814
                                                              323/216
(Continued)

FOREIGN PATENT DOCUMENTS

CN          101251565 A      8/2008
CN          101458308 B      5/2011
(Continued)

OTHER PUBLICATIONS

Ferranti et al.; Transformer Tap changing switch wear monitor; Nov. 6, 1985; GB 2158253 A; Inventor:David Eric Plews; G01R31/00 (Year: 1985).*

(Continued)

*Primary Examiner* — Nasima Monsur
(74) *Attorney, Agent, or Firm* — Seyfarth Shaw LLP; Brian Michaelis

(57) ABSTRACT

The following steps are performed in order to test a tap changer of a transformer which tap changer is designed to change a transmission ratio of the transformer: generating a test signal which is supplied to a winding of the transformer and to the tap changer, repeatedly actuating the tap changer in order to change the transmission ratio with each actuation, determining a curve of an electrical measurement variable ($I$; $I_1$; $I_2$) of the transformer over time ($t$) for each actuation (Continued)

of the tap changer depending on the test signal filtering the curves in order to prevent at least one of the curves from being output outputting the filtered curves.

15 Claims, 8 Drawing Sheets

(56) References Cited

U.S. PATENT DOCUMENTS

| | | | | |
|---|---|---|---|---|
| 9,087,635 | B2* | 7/2015 | Rosado | H01F 29/04 |
| 2003/0038016 | A1 | 2/2003 | Hilal | |
| 2008/0300807 | A1* | 12/2008 | Marti | G01R 31/027 |
| | | | | 702/66 |
| 2010/0263996 | A1* | 10/2010 | Lunn | H01H 9/0016 |
| | | | | 200/11 TC |
| 2017/0269160 | A1* | 9/2017 | Radler | G01R 31/3271 |

FOREIGN PATENT DOCUMENTS

| | | |
|---|---|---|
| CN | 103777139 A | 7/2014 |
| DE | 102012103263 A1 | 10/2013 |
| DE | 102013102709 A1 | 10/2013 |
| EP | 2244272 A1 | 10/2010 |
| GB | 2158253 A | 11/1985 |
| RU | 2290653 C2 | 12/2006 |
| RU | 2342673 C2 | 12/2008 |
| RU | 2516460 C2 | 5/2014 |
| WO | 2011/085763 A1 | 7/2011 |

OTHER PUBLICATIONS

Chinese Search Report dated Jun. 26, 2018.
International Search Report of PCT/EP2015/064712 dated Oct. 22, 2015.

* cited by examiner

METHOD AND DEVICE FOR TESTING A TAP CHANGER OF A TRANSFORMER

TECHNICAL FIELD

The present invention relates to a method and a device for testing a tap changer of a transformer, in particular a power transformer.

BACKGROUND

Electrical power transformers, which are for example used for energy generation, energy transfer, energy distribution or for industrial applications and are designed for outputs greater than 1 MW, often comprise so-called tap changers in order to be able to adapt the transmission ratio of the respective transformer, for example to certain load conditions. Tap changers, which can also be switched during the operation of the transformer or under load, i.e. without interrupting the operation, are often also designated as on-load tap changers (OLTC). To this end, the winding of the transformer is designed as a so-called bank winding, wherein taps or tappings of this bank winding are guided to the tap changer which then switches over from one tap to another tap during the operation of the transformer in order to thereby change the transmission ratio of the transformer.

Since the windings of a transformer respectively constitute a large inductivity, a switching process between different transmission ratios cannot be implemented without problems since it is not possible to easily interrupt the current flow through a winding. A tap changer is thus designed such that the current can flow through the winding at any time. To this end, the tap changer often switches over the current, which flows through the winding, by means of resistors in order to thereby change the transmission ratio. The switching process must be performed quickly in order to avoid excessive heating of the resistors. Regular testing of each tap changer is recommended due to the complex and thus error-prone mechanics of the tap changers.

SUMMARY

The object of the present invention is thus to improve the testing of a tap changer compared to the prior art.

According to the invention, this object is achieved by a method for testing a tap changer of a transformer according to claim 1 and by a device for testing a tap changer of a transformer according to claim 15. The dependent claims define preferred and advantageous embodiments of the present invention.

A method for testing a tap changer of a transformer is prepared within the context of the present invention. In this regard, the tap changer is designed to change (under load) a transmission ratio of the transformer. The method according to the invention comprises the following steps:

Generating a test signal which is supplied to a winding of the transformer and to the tap changer. The test signal may be, for example an electric current which flows through the winding and the tap changer arranged in series with the winding and is typically between a few amperes and approximately 100 amperes strong. The test signal may also be an electric voltage which is applied to the winding and/or to the tap changer such that an electric current results which flows through the series circuit from the winding and the tap changer.

Repeatedly actuating the tap changer, wherein the transmission ratio of the transformer is changed with each actuation of the tap changer. In other words, the transmission ratio of the transformer is repeatedly changed by respectively actuating the tap changer.

Determining a time curve of an electrical measurement variable of the transformer respectively during the actuation of the tap changer, wherein the electrical measurement variable changes depending on the test signal during the switching process (i.e. during the actuation of the tap changer). A current flowing through the winding and the tap changer connected in series and/or a voltage falling on the winding can be measured as the electrical measurement variables, wherein the current and/or the voltage changes by actuating the tap changer depending on the test signal generated. The time curve of the measurement variable can for example be determined by the measurement variable being continually determined during a predetermined time interval or at determined time periods within this time interval (e.g. 100 ms). In this regard, the time interval in particular begins directly before or shortly after the beginning of the actuation of the tap changer and ends after the transmission ratio has been changed by the tap changer or after the most abrupt changes of the measurement variable owing to the actuation of the tap changer or the switching process have abated.

Filtering the time curves in order to prevent at least one of the curves from being output in the following step. The filtering is performed in particular in order to output or illustrate in the following step only ongoing curves, which are as similar as possible. To this end, the filtering can, for example be performed depending on the respective switching process during which the curve is determined. The filtering can, for example take place depending on the tap of the tap changer from which the switching process proceeds, or depending on the tap of the tap changer to which the switching process leads, or depending on whether the transmission ratio is increased or decreased.

In order to test the tap changer, the determined and filtered curves of the measurement variable are illustrated. The illustration of the curves takes place in particular via a display or a screen. However, it is also possible to print out the curves on a printer for the illustration thereof or to illustrate them on other media.

By means of the filtered curves of the electrical measurement variables, the decision regarding whether or not the tap changer is operating correctly, can be made in an improved and simpler manner than is the case according to the prior art. In this regard, the filtered and illustrated curves can also be evaluated by means of historical data (e.g. previously determined curves of the measurement variable).

DETAILED DESCRIPTION

Figure 1:
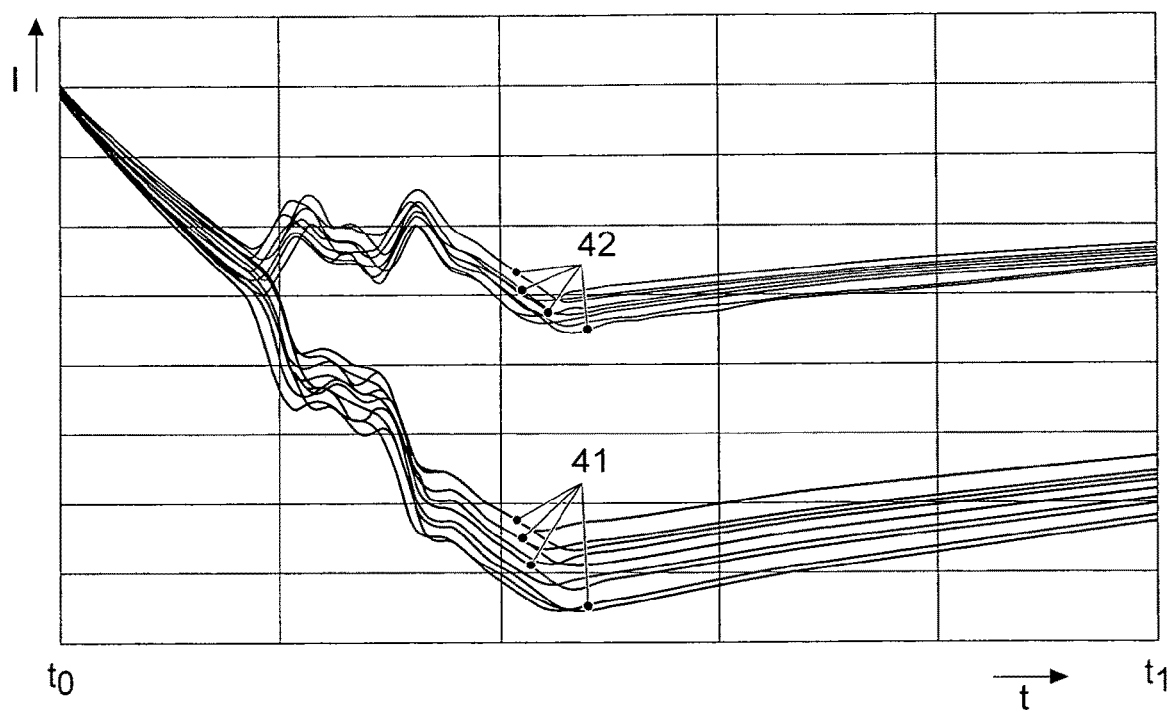
FIG. 1-FIG. 4 illustrate a plurality of time curves of an electric current in the case of actuating a tap chnager of a transformer according to the invention.

According to a preferred embodiment according to the invention, the transformer may be a multi-phase transformer (e.g. a three-phase alternating current transformer). In the case of a multi-phase transformer, a separate tap changer is present for each phase of the transformer which is designed to change (under load) a transmission ratio of the transformer. In order to test the tap changers, a test signal is respectively generated for each phase of the transformer simultaneously. This test signal is, for each phase, supplied to a winding of the transformer assigned to the respective phase and to the tap changer assigned to this winding. If the test signals are respectively a current, a current is for example generated for each phase of the transformer simultaneously which flows through the winding assigned to the respective phase and through the tap changer assigned to the winding, said tap changer being arranged in series with the respective winding. If the test signals are respectively a voltage, a voltage is, for example for each phase of the transformer, simultaneously applied to the winding assigned to this phase in order to thereby generate a current through this winding and the assigned tap changer. The tap changers are actuated repeatedly, wherein the transmission ratio is changed with each actuation. In this regard, the tap changers should all be actuated simultaneously. During the actuation of the tap changers, a time curve of the electrical measurement variable is determined for each tap changer, said electrical measurement variable changes depending on the test signal during the switching process. This measurement variable may be an electric current which flows through one of the windings and the tap changer assigned to this winding and arranged in series with this winding. However, it is also possible for the measurement variable to be an electric voltage which falls on one of the windings. The curves of the measurement variable for the respective tap changer are filtered and illustrated. In this regard, curves of the measurement variable of different phases and/or the same phase can also be filtered and illustrated.

Advantageously, jumps in amplitude that occur or temporal shifts for the different phases can be compared in particular by means of a temporally-superimposed illustration of curves of the measurement variable of different phases in order to decide by means of this comparison whether the tap changers of the multi-phase transformers are operating correctly.

The test signals can be generated for each phase such that the test signals comprise the same value, whereby the recorded curves are directly comparable with each other.

In the case of a three-phase transformer with a star point connection, which preferably comprises a Y or a Z winding, all three-phases can be tested simultaneously. To this end, a current can be impressed as the test signal, which flows, in the case of two phases, into the winding (i.e. the current is impressed on the winding at the end facing away from the star point) and flows, in the case of one phase, from the winding (i.e. the current is removed from the winding at the end facing away from the star point). If the three currents are identical in terms of value, a fourth current additionally flow out (i.e. it is removed from the winding at the end facing away from the star point).

Both in the case of a multi-phase transformer and in the case of a single-phase transformer, the test signal can be a direct current signal, i.e. an electric direct current.

The respective winding in particular comprises a plurality of taps, wherein the switching process from one of these taps to another of these taps takes place with each actuation of the tap changer. As has already been explained, the filtering of the curves can be performed depending on an output tap (i.e. depending on the tap away from which the switching takes place in the switching process) and/or depending on a target tap (i.e. depending on the tap to which the switching takes place in the switching process).

For example, switching can take place in the case of the switching process from one output tap at a first side of the respective winding to a target tap at a second side of the respective winding or from an output tap at the second side to a target tap at the first side. In the case of filtering the curves, either the curves, in which switching takes place to a target tap at the second side, can be eliminated or the curves, in which switching takes place to a target tap at the first side, can be eliminated. In a similar manner, in the case of filtering the curves, the curves in which switching takes place from an output tap at the first side can be eliminated or the curves in which switching takes place from an output tap at the second side, can be eliminated.

Furthermore, a determined target tap (i.e. a determined tap to which switching takes place) can be predefined. In the case of filtering the curves, the curves, in which switching does not take place to the determined target tap, can then be eliminated. In a similar manner, a determined output tap (i.e. a determined tap from which switching takes place) can also be predefined. In the case of filtering the curves, the curves, in which switching does not take place from the determined target tap, can then be eliminated.

The filtering of the time curves of the measurement variable depending on the taps of the respective winding offers numerous options for filtering the determined curves. For example, the curves can be filtered such that curves of even or odd switching processes (i.e. switching processes to a target tap on a determined (first or second) side or switching processes from an output tap on a determined (first or second side)) are eliminated such that subsequently only the respectively other switching processes (i.e. only the odd or only the even switching processes) are illustrated. Furthermore, all curves can also be eliminated, in which the switching process does not switch to a determined target tap or in which the switching process does not switch from a determined output tap.

According to a preferred embodiment according to the invention, in the case of filtering the curves, the curves, in which the transmission ratio is increased by the switching process, are eliminated. In the same manner, in the case of filtering the curves, the curves in which the transmission ratio is decreased by the switching process can be eliminated.

In the case of this embodiment, advantageously only curves in which the transmission ratio is decreased or increased in the corresponding switching process are illustrated.

Furthermore, in the case of filtering the curves, all curves of at least one determined phase of a multi-phase transformer can be eliminated.

In the case of a three-phase transformer, the curves of precisely one determined phase can thus be eliminated such that the curves of the two other phases are illustrated. However, it is also possible for the curves of two determined phases to be eliminated such that only the curves of a determined phase are illustrated.

The previously described filter criteria or options for filtering the curves can be combined such that it is for example possible to illustrate only all even switching processes of a determined phase.

According to the invention, the pre-filtered time curves can be output or illustrated in a temporally-superimposed manner. This means that at least two time curves of the measurement variable, which have been pre-filtered, are output or illustrated in a temporally-superimposed manner. According to the invention, it is, however, possible to illustrate more than two (i.e. any number) of filtered time curves of the measurement variable in a temporally-superimposed manner.

The length of the time interval, during which the curve of the respective measurement variable is determined, can be selected such that the transformer reaches saturation after switching to the new transmission ratio in order to also determine the resistance of the winding by means of the determined measurement variable.

It is in particular understood by the temporally-superimposed illustration of the filtered curves that a temporal end of each of the illustrated curves is plotted after all temporal beginnings of the illustrated curves.

In the case of the temporally-superimposed illustration of the filtered curves of the respectively determined electrical measurement variable, there is, on the one hand, the possibility to plot curves as congruently as possible such that for example two identical curves are illustrated precisely over each other. Another possibility according to the invention is to plot the filtered curves (slightly) offset such that for example two identical curves can be distinguished. In this regard, the curves can be illustrated offset either in the direction of the time axis and/or perpendicular to the time axis.

For the temporally-superimposed illustration of the filtered curves, time periods of the curves corresponding to each other are in particular illustrated in a temporally-superimposed manner. As was already previously described, the respectively corresponding time period or the respectively corresponding time interval of the respective curve can begin shortly before or shortly after the respective actuation of the tap changer and can end after the end of the performance of the switching to a new transmission ratio. The respective time period of the respective curve can for example be 100 ms of the respective switching process.

As is similarly at least partially previously described, the electrical measurement variable can comprise one or a plurality of the following electrical measurement variables:
  the electric current which flows through the respective winding and the tap changer assigned to this winding.
  the electric voltage which falls on the respective winding.
  an electrical resistance value which is calculated depending on the voltage and the current (in particular as a quotient from the voltage and the current). This resistance value may be an ohmic resistance value or direct current resistance value or an impedance value or alternating current resistance.

According to the invention, the measurement variable may also be another electrical variable, such as for example the electrical output or the electric energy which is received by the respective winding or delivered by the same.

In the context of the present invention, a device for testing a tap changer of a transformer is also prepared. In this regard, the tap changer is designed to change (under load or during operation) a transmission ratio of the transformer. The device comprises test signal generation means, measuring means and control means. By means of the test signal generation means and the control means, the device generates a test signal which is supplied to a winding of the transformer and to the tap changer. By means of the measuring means, the device is capable of determining a time curve of an electrical measurement variable of the transformer respectively during an actuation of the tap changer depending on the test signal. The control means are designed to filter the curves and to illustrate the filtered curves (e.g. in a temporally-superimposed manner).

The advantages of the device according to the invention correspond substantially to the advantages of the method according to the invention which were previously explained in detail such that they will not be repeated here.

According to an embodiment according to the invention, the transformer may be a multi-phase transformer, wherein a separate tap changer is present for each phase of the transformer, said tap changer is designed to change (under load) a transmission ratio of the transformer. According to this embodiment according to the invention, the device is thus designed to test a tap changer or the tap changers of a multi-phase transformer. Furthermore, the device is designed to simultaneously generate respectively one test signal for each phase of the transformer by means of the test signal generation means and to supply these test signals respectively (i.e. respectively one of these test signals) to a winding of the transformer assigned to the respective phase or to the tap changer assigned to this winding. The device is capable of determining a time curve of an electrical measurement variable of the transformer respectively during an actuation of the tap changer by means of the measuring means for each tap changer. The device according to the invention filters the previously determined curves by means of the control means and illustrates the previously filtered curves (e.g. in a temporally-superimposed manner) for each tap changer.

The advantages of this embodiment according to the invention correspond substantially to the advantages of the corresponding embodiment of the method according to the invention which were previously explained in detail such that they will not be repeated here.

The device in particular comprises a display and is designed such that the device illustrates the filtered curves on this display by means of the control means.

The interpretation of the determined measurement variables is simplified in comparison to the prior art by means of the graphic illustration of the filtered curves of the electrical measurement variable for the respective tap changer. As a result, the testing of the tap changer is ultimately also simplified.

The present invention can in particular be used for testing tap changers of power transformers. The present invention is of course not limited to this preferred field of application since the invention can for example also be used to test tap changers of transformers which are not considered power transformers.

The invention is described in detail below by means of preferred embodiments according to the invention with reference to the figures.

A plurality of time curves of an electric current is illustrated in FIG. 1 in the case of actuating a tap changer of a transformer according to the invention.

Figure 2:
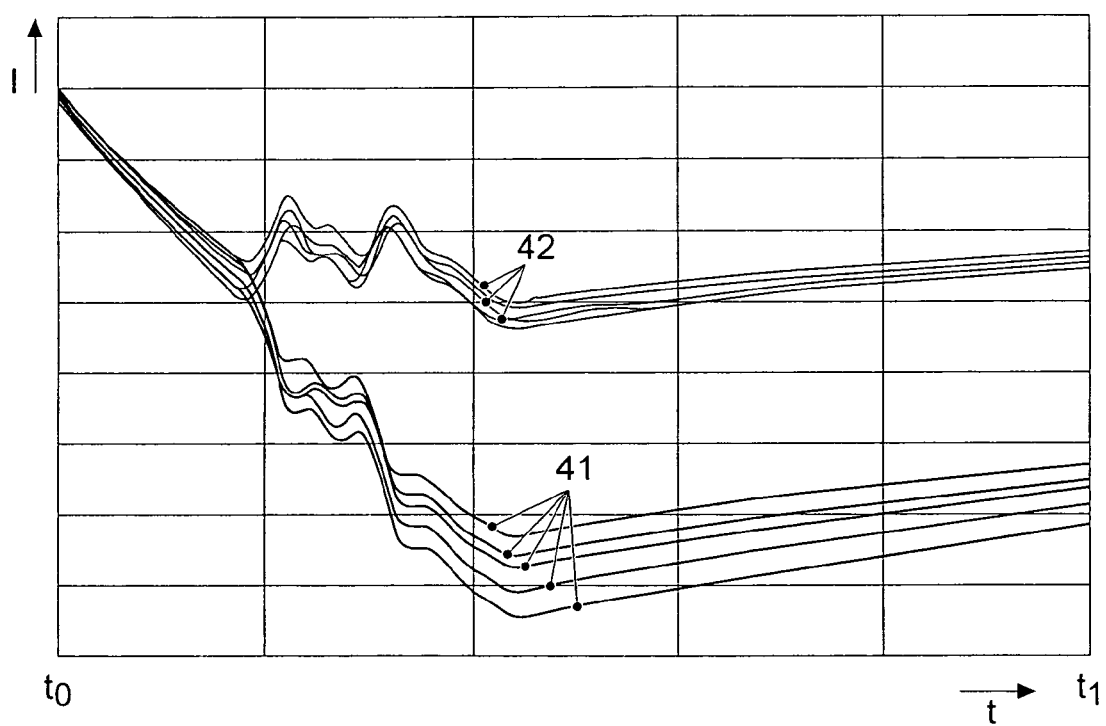
Figure 3:
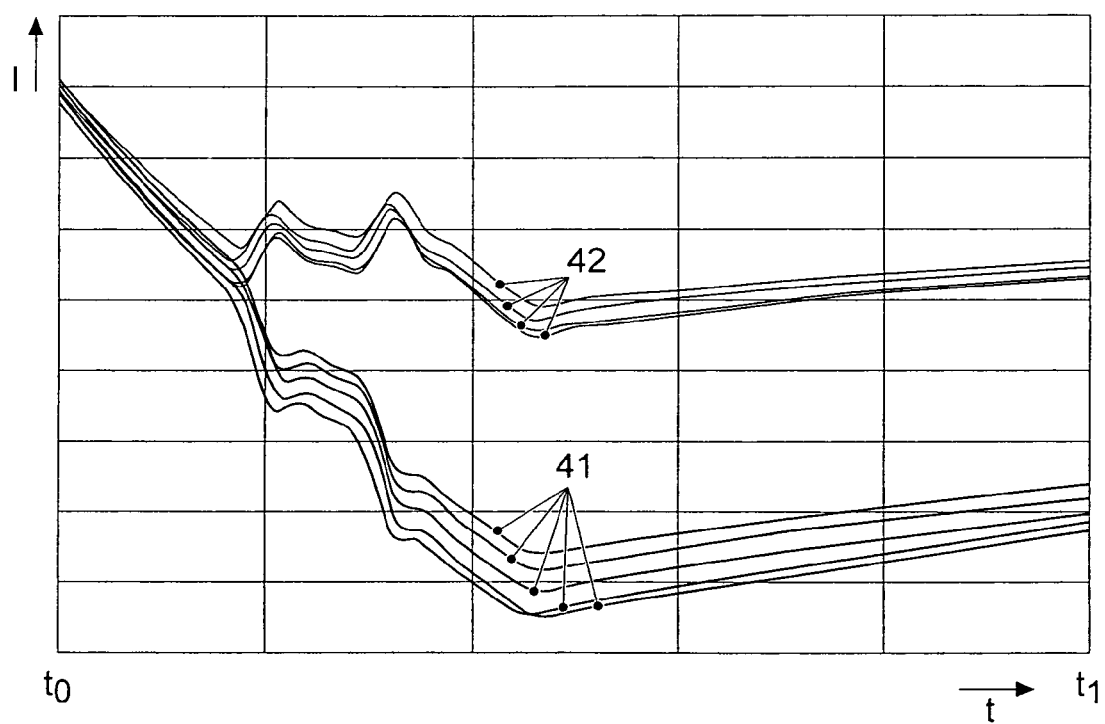
Figure 4:
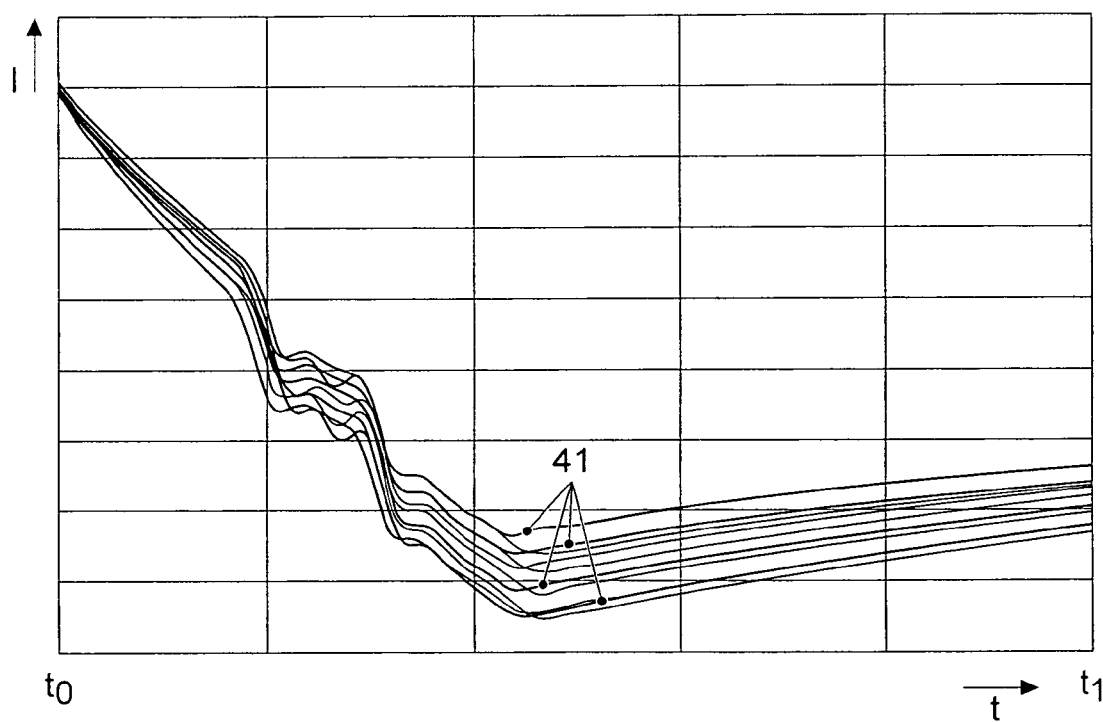

Only certain time curves of those illustrated in FIG. 1 are illustrated in FIGS. 2 to 4.

Figure 5:
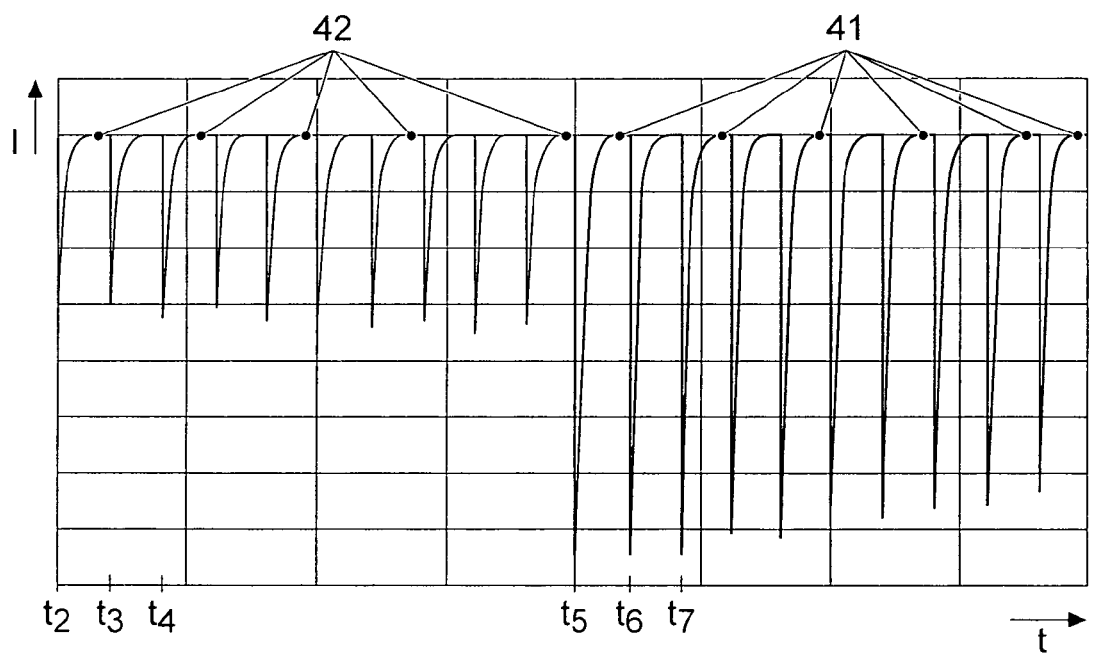
FIG. 5 illustrates the time curves of an electric current in the case of actuating a tap changer of a transformer illustrated chronologically.

The time curves of an electric current in the case of actuating a tap changer of a transformer are not illustrated in a temporally-superimposed manner in FIG. 5, but rather they are illustrated chronologically.

Figure 6:
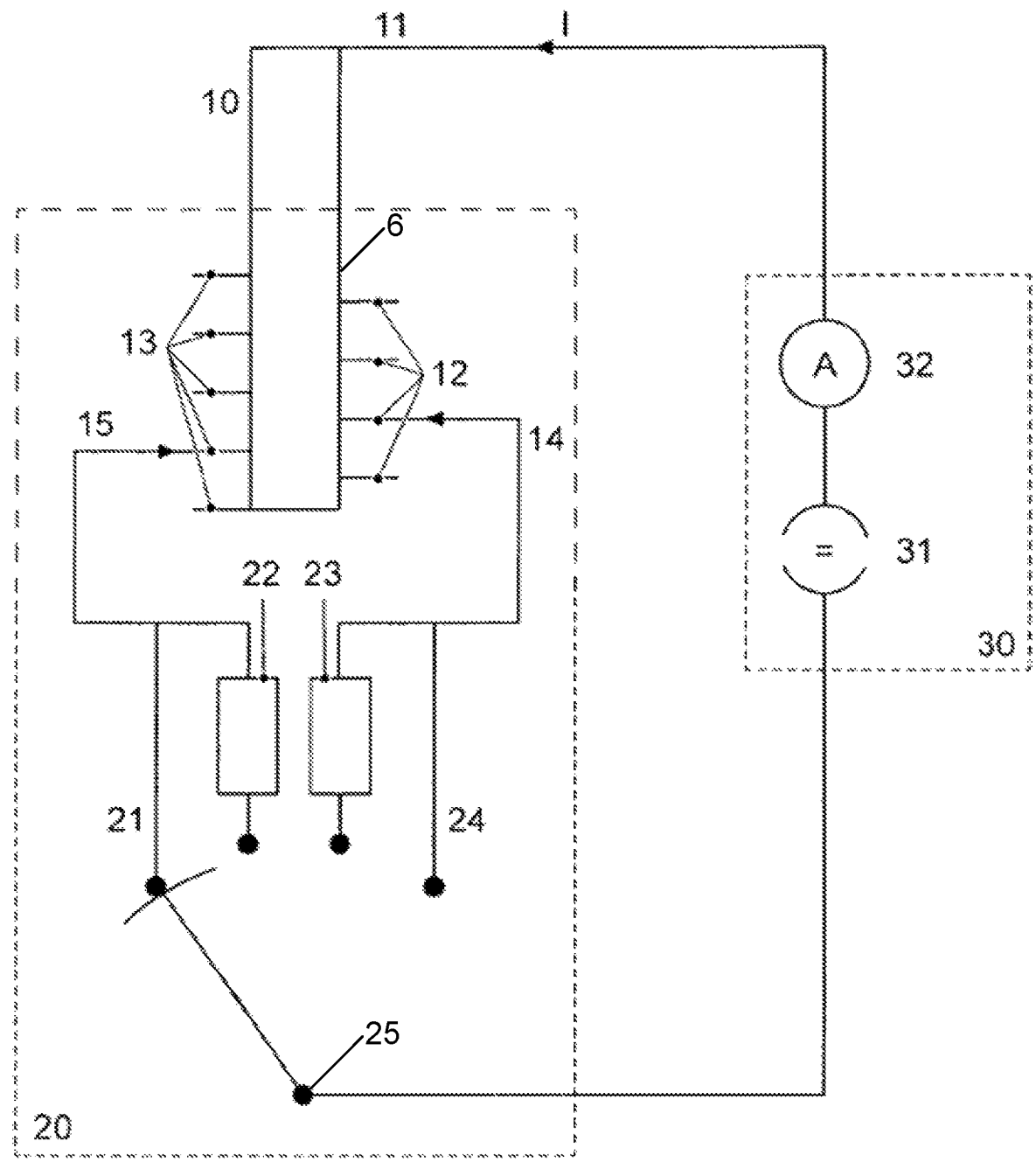
FIG. 6 illustrates a transformer with tap changer illustrated together with a device according to the invention.

A transformer with tap changer is illustrated together with a device according to the invention in FIG. 6.

Figure 7:
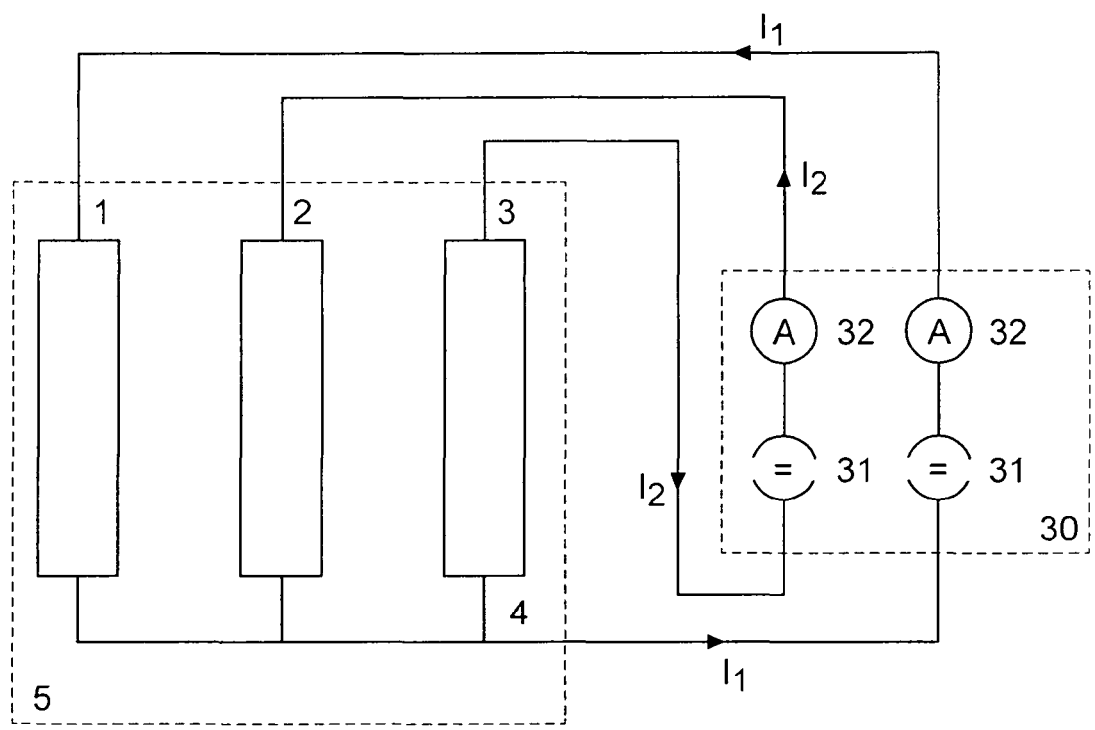
FIG. 7 illustrates a multi-phase transformer illustrated together with a device according to the invention.

A multi-phase transformer is illustrated together with a device according to the invention in FIG. 7.

Figure 8:
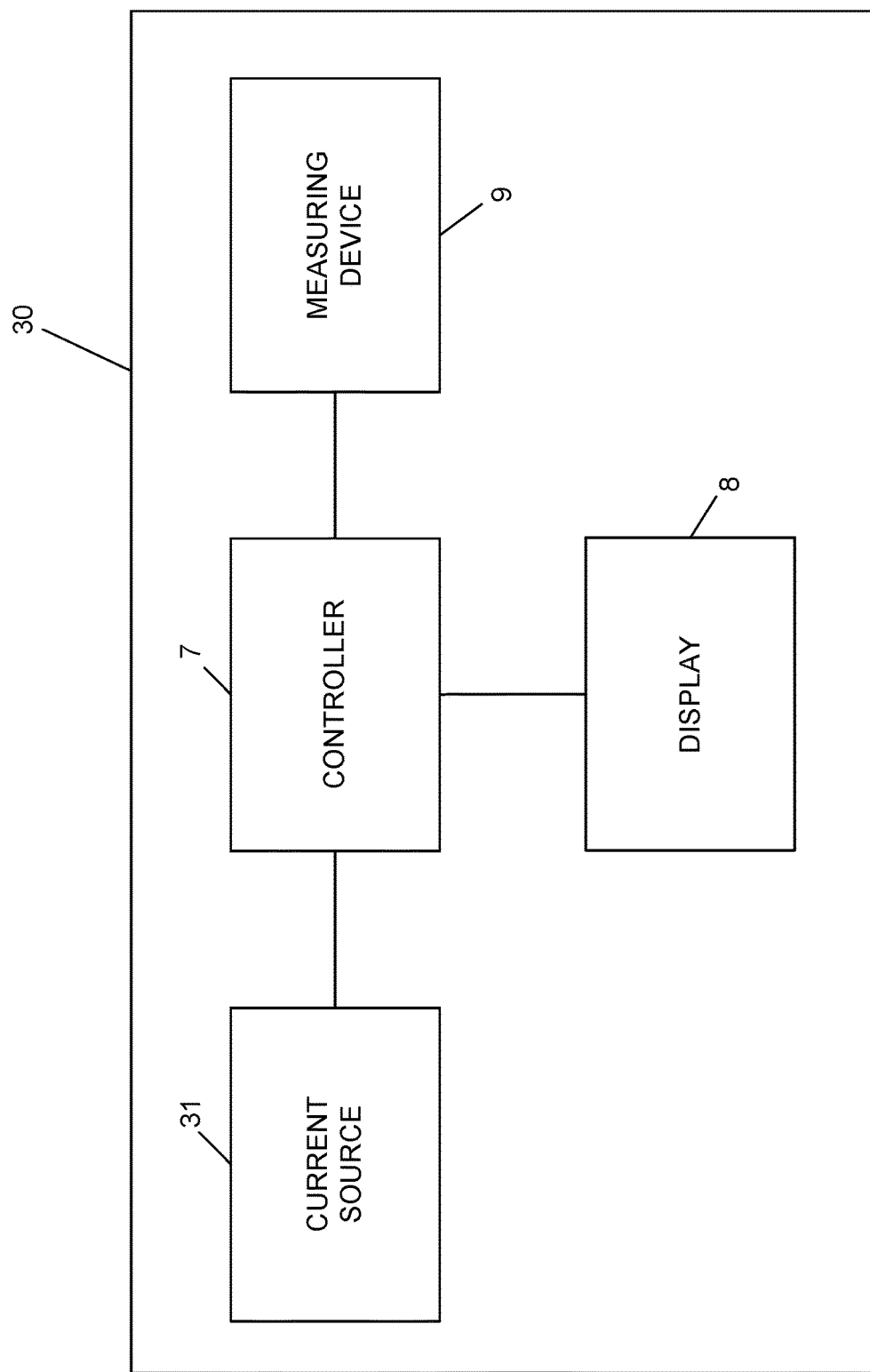
FIG. 8 illustrates a block diagram of device according to the invention.

A device according to the invention is schematically illustrated in FIG. 8.

Although one electric current is respectively illustrated in the following figures by way of example both as a test signal and as a measurement variable, it should be noted that according to the invention a voltage can also be applied as the test signal and/or that a voltage, an electrical resistance, an impedance, an output, energy etc can also be used or determined as a measurement variable.

A plurality of time curves 41, 42 of an electric current are illustrated in a temporally-superimposed manner according to the invention in FIG. 1, wherein each of the curves 41, 42 is determined in the case of the actuation of a tap changer of a transformer. The electric current, the curve of which is determined, flows through the winding and the tap changer arranged in series with the winding. A time period is respectively illustrated for each of the curves which begins at a first time point $t_0$ and ends at a second time point $t_1$. In this regard, the first time point $t_0$ comes shortly after the beginning of the actuation of the tap changer and the second time point $t_1$ comes after the end of the switching process of the tap changer.

In the present case, the winding comprises eleven taps or tappings between which the tap changer can be switched, as is explained more precisely in FIG. 6. The curves labelled with the reference numeral 41 respectively show one of ten current curves which are determined when the tap changer switches upwards, whereby the number of the effective coils of winding is reduced. In a similar manner, the curves labelled with the reference numeral 42 respectively show one of ten current curves which are determined when the tap changer switches downwards, whereby the number of the effective coils of the winding is increased.

As illustrated in FIG. 6, there are left-hand or odd taps 13 and right-hand or even taps 12 of the winding 10. Only the current curves 41, 42 in the case of even switching processes are illustrated in FIG. 2 by eliminating the current curves in the case of odd switching processes by means of filters. An even switching process is then present when switching takes place to an even or right-hand tap 12. In this regard, switching can take place to an even or right-hand tap 12 both in the case of downwards switching and in the case of upwards switching. In other words, the current curves labelled with the reference numeral 41 in FIG. 2 show five even switching processes in the case of downwards switching, while the current curves labelled with the reference numeral 42 in FIG. 2 show five even switching processes in the case of upwards switching.

In contrast, only the current curves 41, 42 in the case of odd switching processes are illustrated in FIG. 3 by eliminating the current curves in the case of even switching processes by means of filters. An odd switching process is then present when switching takes place to an odd or left-hand tap 13 (see FIG. 6). Like in the case of even switching processes, in the case of odd switching processes, switching can take place to an odd or left-hand tap 13 both in the case of downwards switching and in the case of upwards switching. In other words, the current curves labelled with the reference numeral 41 in FIG. 3 show five odd switching processes in the case of downwards switching, while the current curves labelled with the reference numeral 42 in FIG. 3 show five odd switching processes in the case of upwards switching.

Only the ten current curves 41 in the case of even switching processes are illustrated in FIG. 4 such that the ten current curves 42 in the case of odd switching processes (see FIG. 1) are not illustrated since they have been filtered out.

The 20 current curves 41, 42 from FIG. 1 are illustrated in FIG. 5 chronologically side by side. In this connection, a time point (e.g. $t_3$ or $t_6$), at which a current curve 41, 42 ends, corresponds to a time point at which a current curve illustrated adjacent thereto begins. In other words, the current curves illustrated in FIG. 5 are not illustrated in a temporally-superimposed manner.

A transformer 6 with a tap changer 20 and a device 30 according to the invention for testing the tap changer 20 are illustrated in FIG. 6.

The transformer 6 comprises a winding 10 which has a plurality of taps or tappings 12, 13. The tap changer 20 comprises two tap selectors 14, 15. In this regard, the one tap selector 14 is connected to one of the right-hand or even taps 12 and the other tap selector 15 is connected to one of the left-hand or odd taps 13. Furthermore, the tap changer 20 comprises a first connection 21 and a first resistor 22 which are assigned to the tap selector 15 as well as a second connection 24 and a second resistor 23 which are assigned to the tap selector 14. In the case of the condition illustrated in FIG. 6, a current I flows at connection 11 into the winding 10 and flows out from the winding 10 at the tap 13 which is in contact with the tap selector 15.

In order to now change the transmission ratio of the transformer 6, a switch 25 of the tap changer 20 is switched from connection 21 to connection 24. The switch 25 here contacts in a first step both the first connection 21 and the first resistor 22 such that the current I flows through the first resistor 22 if the switch 25 loses the contact to the first connection 21 in the second step. In the third step, the switch 25 contacts both the first resistor 22 and the second resistor 23 such that the current I flows both via the first resistor 22 and via the second resistor 23 and thus both via the tap selector 15 and the corresponding tap 13 and via the tap selector 14 and the corresponding taps 12. If the switch 25 is switched further, the switch 25 loses the contact with the first resistor 22 in the fourth step such that the current I flows in the fourth step only via the second resistor 23 and the tap selector 14 and the corresponding tap 12. If the switch 25 is switched further, the switch 25 contacts the second connection 24 in the fifth step such that the second resistor 23 is virtually short-circuited. The current I flows via the second connection 24 as well as the tap selector 14 and the associated tap 12 such that the transmission ratio of the transformer 6 changes correspondingly. If the switch 25 is switched further, the switch 25 loses the contact to the second resistor 23 in the sixth and final step, whereby the switching process or the actuation of the tap changer 20 for changing the transmission ratio of the transformer 6 has finally ended.

As soon as the tap selector 15 is switched in a currentless manner (i.e. with the fourth step), the tap selector can be connected to another left-hand or odd tap 13. In order to once again change the transmission ratio of the transformer 6, the switch 25 is switched in a similar manner as previously described from the second connection 24 to the first connection 21.

In order to test the tap changer 20, the device 30 according to the invention is present which has a current source 31 and an ammeter 32. The current I is generated by means of the current source 31 which flows through the winding 10 and the tap changer 20 arranged in series with the winding 10. A time curve of the current I flowing through the winding 10 and the tap changer 20 is in particular determined during the switching over of the tap changer 20 with the corresponding measuring device 9 (see FIG. 8) of the device 30 according to the invention. After determining a plurality of current curves, which are determined during respective switching over processes of the tap changer 20, these current curves are filtered according to predetermined filtering criteria and illustrated in a temporally-superimposed manner.

A multi-phase transformer 5 is illustrated in FIG. 7 which has three phases with respectively one winding 1-3 in a Y-interconnection. In this regard, each phase or winding 1-3 has a tap changer 20 (not illustrated in FIG. 7) in order to change the transmission ratio of the transformer 5 in the same manner as was previously described with regard to FIG. 6.

In order to test the tap changer, the device 30 according to the invention generates a first direct current $I_1$ which is supplied to the end of the first winding 1 facing away from the star point 4 and a second direct current $I_2$ which is, on the one hand, taken away from the end of the third winding 3 facing away from the star point 4 and, on the other hand, is supplied to the end of the second winding 2 facing away from the star point 4. It can be discerned that the first direct current $I_1$ also flows away from the star point 4 to the device 30. In other words, the test signals or direct currents $I_1$, $I_2$, which are supplied to each winding 1-3, comprise the same value.

The time curves of the currents through the three windings 1-3 are determined, while the tap changers are repeatedly switched in order to change the transmission ratio of the multi-phase transformer 5. A plurality of determined and filtered current curves are illustrated in a temporally-superimposed manner for each tap changer in order to test the correct operation of the tap changers.

A further embodiment of the device 30 according to the invention is schematically illustrated in FIG. 8. In addition to a current source 31 which corresponds to the test signal generation means, the device 30 comprises, a controller 7, a display 8 and a measuring means 9 by means of which a time curve 41, 42 of the electrical measurement variable can be determined. The determined and filtered time curves 41, 42 are illustrated on the display 8 in a temporally-superimposed manner.

LIST OF REFERENCE NUMERALS 1-3 Winding
4 Star point
5 Three-phase alternating current transformer
6 Transformer
7 Controller
8 Display
9 Measuring device
10 Winding
14, 15 Tap selectors
12, 13 Tap
20 Tap changer
11, 21, 24 Connection
22, 23 Resistor
30 Device
31 Current source
32 Ammeter
41 Current curve in the case of downwards switching
42 Current curve in the case of upwards switching
I, I1, I2 Direct current
t Time
$t_x$ Time point

The invention claimed is:

1. Method for testing a complete tap changer of a multi-phase transformer having a winding comprising a plurality of taps between which the tap changer can be switched, wherein a separate tap changer is present for each phase of the multi-phase transformer and each separate tap changer is designed to change a transmission ratio of the transformer, wherein the method comprises the following steps:
   generating a respective test signal for each phase of the multi-phase transformer which is supplied to the winding of the multi-phase transformer assigned to the respective phase and to the tap changer,
   repeatedly actuating the tap changer to cause the tap changer to switch between each of the plurality of taps in order to change the transmission ratio with each actuation for testing the complete tap changer,
   determining a curve of an electrical measurement variable of the multi-phase transformer over time for each switch of the tap changer between each of the plurality of taps depending on the test signal,
   filtering the curves in order to prevent selected curves from switching of selected taps of the plurality of taps from being output, and
   outputting the filtered curves representing testing of the complete tap changer.

2. Method according to claim 1, wherein the test signals for each phase are generated identically in terms of value.

3. Method according to claim 1, wherein the test signal is a direct current signal.

4. Method according to claim 1, wherein the filtering of the curves is performed depending on an output tap of the taps away from which switching takes place in the case of actuation and/or depending on a target tap of the taps to which switching takes place in the case of actuation.

5. Method according to claim 4, wherein in the case of actuating the respective tap changer switching takes place from one of the taps at a first side to one of the taps at a second side or from one of the taps at the second side to one of the taps at the first, and wherein in the case of filtering the curves, either the curves in which switching takes place to one of the taps at the second side are eliminated or the curves in which switching takes place to one of the taps at the first side are eliminated.

6. Method according to claim 4, wherein a determined target tap of the taps is predefined and
wherein in the case of filtering the curves, the curves in which switching does not take place to the determined target tap are eliminated.

7. Method according to claim 4, wherein in the case of filtering the curves, the curves, in which the transmission ratio is increased when actuating respective tap changer, are eliminated, or wherein in the case of filtering the curves, the curves in which the transmission ratio is decreased when actuating respective tap changer are eliminated.

8. Method according to claim 1, wherein in the case of filtering the curves, the curves of at least one determined phase are eliminated.

9. Method according to claim 1, wherein in the case of outputting the filtered curves, the curves are illustrated in a temporally-superimposed manner.

10. Method according to claim 9,
wherein the curves are illustrated as congruently as possible.

11. Method according to claim 9,
wherein the curves are plotted in an offset manner.

12. Method according to claim 9,
wherein time periods of the curves corresponding to each other are illustrated in a temporally-superimposed manner.

13. Method according to claim 1,
wherein the electrical measurement variable comprises one of:
a current which flows through the winding and the tap changer,
a voltage drop at the winding, and
an electrical resistance value which can be calculated depending on the voltage and the current.

14. Apparatus for testing a complete tap changer of a multi-phase transformer having a winding comprising a plurality of taps between which the tap changer can be switched, wherein a separate tap changer is present for each phase of the multi-phase transformer and each separate tap changer is designed to change a transmission ratio of the transformer, wherein the apparatus comprises:
a test signal generation device, a measuring device and a control device,
wherein the apparatus is designed to supply a respective test signal for each phase of the multi-phase transformer to the winding of the multi-phase transformer assigned to the respective phase and to the tap changer by means of the test signal generation device and the control device,
wherein the apparatus is designed to repeatedly actuate the tap changer to cause the tap changer to switch between each of the plurality of taps in order to change the transmission ratio with each actuation and test completely the tap changer,
wherein the apparatus is designed to determine a curve of an electrical measurement variable of the multi-stage transformer by means of the measuring device over time respectively during each switch of the tap changer between each of the plurality of taps depending on the test signal,
wherein the control device is designed to filter the curves in order to prevent selected curves from the switching between selected taps of the plurality of taps from being output, and
wherein the control device is designed to output the filtered curves representing complete testing of the tap changer.

15. Apparatus according to claim 4,
wherein the apparatus comprises a display,
wherein the apparatus is designed such that the control device illustrates the filtered curves on the display.

* * * * *